United States Patent
Kobayashi

(10) Patent No.: US 8,020,121 B2
(45) Date of Patent: Sep. 13, 2011

(54) LAYOUT METHOD AND LAYOUT APPARATUS FOR SEMICONDUCTOR INTEGRATED CIRCUIT

(75) Inventor: Naohiro Kobayashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 481 days.

(21) Appl. No.: 12/230,629

(22) Filed: Sep. 2, 2008

(65) Prior Publication Data

US 2009/0093099 A1 Apr. 9, 2009

(30) Foreign Application Priority Data

Sep. 7, 2007 (JP) ................................. 2007-233285

(51) Int. Cl.
*G06F 17/50* (2006.01)
(52) U.S. Cl. .......... 716/55; 716/118; 716/119; 716/122; 716/139
(58) Field of Classification Search ................. 716/53, 716/118, 119, 122, 55, 139; 438/403
See application file for complete search history.

(56) References Cited

U.S. PATENT DOCUMENTS

| | | | | |
|---|---|---|---|---|
| 5,824,570 A | * | 10/1998 | Aoki et al. | 438/128 |
| 6,691,297 B1 | * | 2/2004 | Misaka et al. | 716/53 |
| 7,103,870 B2 | * | 9/2006 | Misaka et al. | 716/52 |
| 7,137,092 B2 | * | 11/2006 | Maeda | 716/53 |
| 7,404,165 B2 | * | 7/2008 | Misaka et al. | 716/52 |

FOREIGN PATENT DOCUMENTS

JP 2004-288685 10/2004

* cited by examiner

*Primary Examiner* — Sun J Lin
(74) *Attorney, Agent, or Firm* — McGinn IP Law Group, PLLC

(57) ABSTRACT

In a layout method for a semiconductor integrated circuit by using cell library data, a plurality of cell patterns are arranged in a first direction. One of gate patterns in one of the plurality of cell patterns is specified as a reference gate pattern. An additional cell pattern is arranged in a second direction orthogonal to the first direction such that a number of gate patterns within a predetermined area containing the reference gate pattern satisfies a constraint condition.

19 Claims, 14 Drawing Sheets

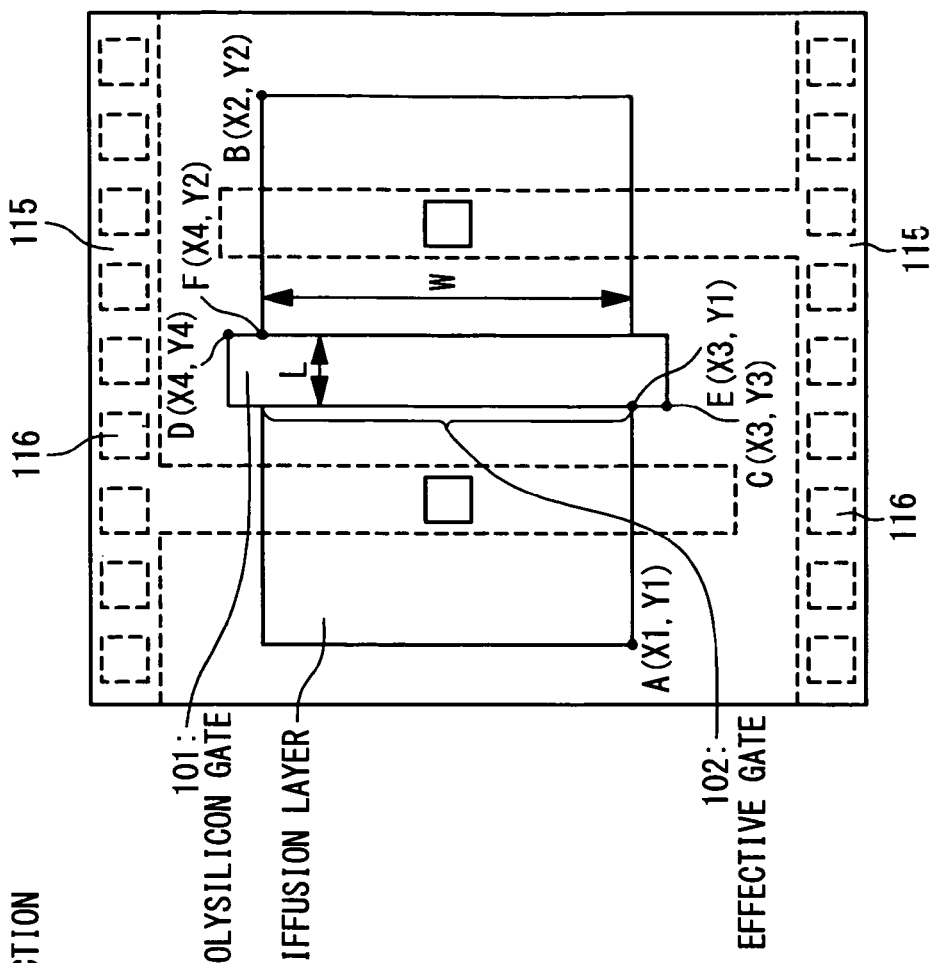
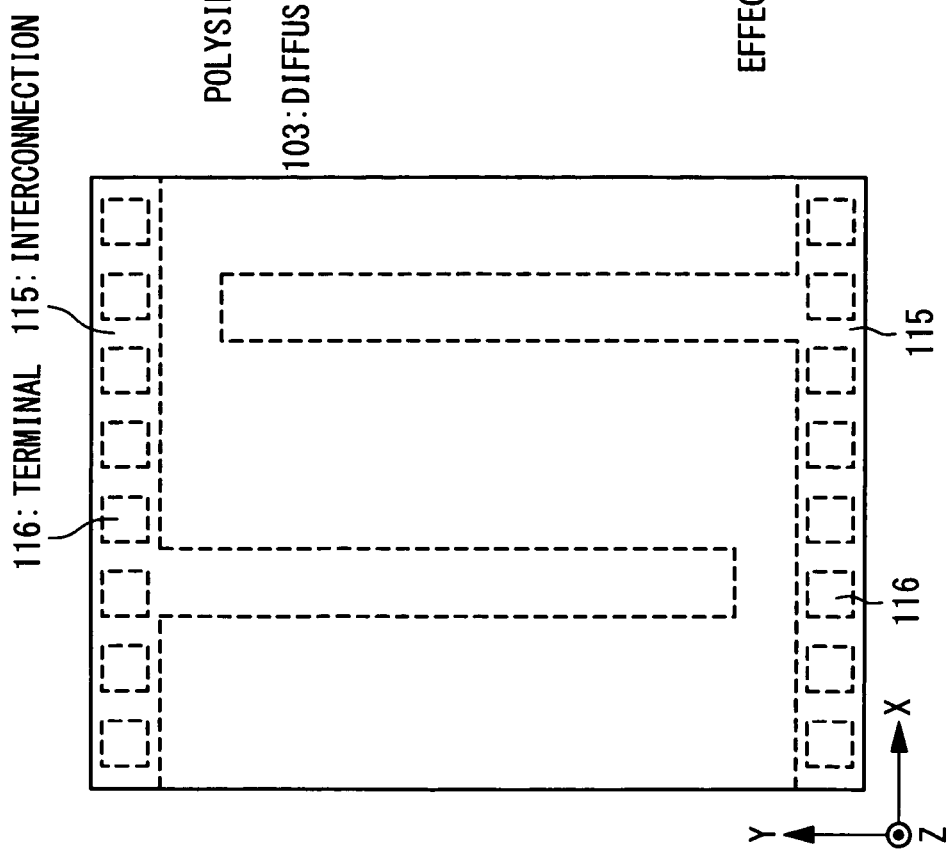

LAYOUT METHOD AND LAYOUT APPARATUS FOR SEMICONDUCTOR INTEGRATED CIRCUIT

INCORPORATION BY REFERENCE

This patent application claims priority on convention based on Japanese Patent Application No. 2007-233285 filed on Sep. 7, 2007. The disclosure thereof is incorporated herein by reference.

BACKGROUND OF THE INVENTION

1. Field of the Invention

The present invention relates to a layout method and a layout apparatus for a semiconductor integrated circuit, and more particularly, to a layout method, and a layout apparatus for a semiconductor integrated circuit for performing cell-based layout of a semiconductor integrated circuit by using library data.

2. Description of Related Art

A cell-based IC (Integrated Circuit) is suitably used for an LSI such as an ASIC (Application Specific Integrated Circuit), an ASSP (Application Specific Standard Product) and a microprocessor, in which high integration and high performance are requested. The cell-based IC is manufactured by combining cells provided by a semiconductor maker and individual circuits designed by the user. Various types and size of cell patterns are provided in the cell library and include a primitive cell pattern in which a pattern for a basic circuit is provided and a macro cell in which a pattern for a circuit such as a CPU and a memory is provided. Since such cells are arranged and wired on an area for a semiconductor chip by using an arrangement & wiring tool, design time and design cost can be reduced. Also, since a layout of CPU or the like can be incorporated as a macro cell, a system LSI can be easily designed.

However, with reduction in a wiring width in the LSI, variation in a gate size due to an optical proximity effect and variation in an amount of etching causes a problem. When a gate density varies depending on location in a gate peripheral area, a gate pattern varies in shape depending on location due to the optical proximity effect. Also, since a degree of penetration of etchant varies depending on the pattern density, a variation in gate size and gate shape after etching is caused at locations of different gate densities. Variation in characteristics of a transistor due to variation in gate size degrades product performance and contributes to a decrease in yields. For this reason, generally in a layout design phase, OPC (Optical Proximity Correction) processing is performed to correct a mask pattern in consideration of the optical proximity effect. A correction pattern is added or gate size is corrected, in the OPC processing, in consideration of the variation in gate size due to the optical proximity effect.

As the wiring width in LSI is further decreased, OPC processing with higher accuracy has been required. For this reason, an amount of calculation and thus calculation time of the OPC processing have increased.

A technique for solving such problems is described in, for example, Japanese Patent Application Publication (JP-P2004-288685A). In this example, a layout designing method for a semiconductor integrated circuit includes a step of arranging a dummy polysilicon fill cell adjacent to a boundary of a basic cell arrangement inhibition area. Thus, the basic cell or the dummy polysilicon fill cell is necessarily arranged in an area adjacent to the basic cell pattern. As a result, a distance between a gate pattern in the basic cell pattern and a gate pattern (or polysilicon interconnection pattern) in another cell (including a dummy polysilicon fill cell) falls within a certain range. Thereby, variation of the gate due to the optical proximity effect and an etching can be suppressed.

According to a conventional technique, the dummy polysilicon fill cell for suppressing an optical proximity effect is arranged to be adjacent to a basic cell located in a direction perpendicular to a gate channel direction (column direction). For this reason, cells are laid out so that a distance between a gate pattern in the basic cell and a polysilicon gate pattern in the cell adjacent to the basic cell in a column direction falls within a certain range.

However, according to the method described in Japanese Patent Application Publication (JP-P2004-288685A), a distance between the gate pattern in the basic cell and the gate pattern in the cell pattern adjacent to the basic cell pattern in a row direction is not considered. For this reason, in a vicinity of boundary of the adjacent different cell lines, a distance between the gate patterns and a data density (gate area density in consideration of a gate length, a gate width and the number of gates) may represent different values. Hereinafter, this conventional technique will be described with reference to FIG. 1.

FIG. 1 is a plan view showing a layout of the semiconductor chip on which cells are arranged according to a method of conventional technique. Here, it is assumed that a plurality of cell patterns 100 are aligned in a row Li on a pattern of a semiconductor chip 1, and cell patterns 110, 120 and 130 are aligned in an adjacent row Li−1. Here, a direction of the gate pattern width is defined as a column direction (Y direction) and a direction perpendicular to the gate width is defined as row direction (X direction).

Generally, cells are arranged in consideration of area costs and wiring. However, a gate data density in a vicinity of a boundary of adjacent cells in the Y direction is not considered. For this reason, even in the boundary of adjacent cell patterns in the Y direction, areas of higher data density and lower data density appear depending on location. For example, referring to FIG. 1, with respect to gate patterns in the cell patterns 100 in the row Li adjacent to the row Li−1, data densities of the gate patterns in peripheral areas are compared with each other. Here, a periphery of the gate pattern in the cell pattern 100 adjacent to the cell pattern 110 is defined as an area A0, a periphery of the gate pattern in the cell pattern 100 adjacent to the cell pattern 120 is defined as an area B0 and the periphery of the gate pattern in the cell pattern 100 adjacent to the cell pattern 130 is defined as an area C0. Given that the data density of the gate pattern in the area B0 is a reference density, since a gate distribution in the cell patterns in the column direction (Y direction) is not considered, data densities in the area A0 and the area C0 may be different from the reference density. Here, the data density in the area A0 is higher than the reference density and the data density in the area C0 is lower than the reference density.

As described above, when layout is performed without considering the gate densities in the vicinity of the boundary of the adjacent cells in the column direction (Y direction), the data densities in the gate peripheral areas provided in the vicinity of the boundary may become ununiform. In this case, the shape of gate pattern varies due to the optical proximity effect, depending on a different gate density. Since the amount of etching varies depending on gate density, gate size and gate shape vary depending on the different gate density. For this reason, according to the layout method of the conventional technique, driving characteristics of a transistor provided in the vicinity of the boundary of adjacent cells in the column direction are within a variation, deteriorating product performance.

SUMMARY

In a first aspect of the present invention, a layout method for a semiconductor integrated circuit by using cell library data, includes: arranging a plurality of cell patterns in a first direction; specifying one of gate patterns in one of the plurality of cell patterns as a reference gate pattern; and arranging an additional cell pattern in a second direction orthogonal to the first direction such that a number of gate patterns within a predetermined area containing the reference gate pattern satisfies a constraint condition.

In a second aspect of the present invention, a layout apparatus includes a storage unit configured to store cell library data; and an arrangement & wiring tool configured to arrange a plurality of cell patterns in a first direction, by using the cell library data. The arrangement & wiring tool includes a reference gate specifying section configured to specify one of gate patterns in one of the plurality of cell patterns as a reference gate pattern; and a layout section configured to arrange an additional cell pattern in a second direction orthogonal to the first direction such that a number of gate patters in a predetermined area containing the reference gate pattern satisfies a constraint condition.

In a third aspect of the present invention, a computer-readable medium which stores instructions which make a computer to realize a layout method for a semiconductor integrated circuit by using cell library data, the layout method includes: arranging a plurality of cell patterns in a first direction; specifying one of gate patterns in one of the plurality of cell patterns as a reference gate pattern; and arranging an additional cell pattern in a second direction orthogonal to the first direction such that a number of gate patterns within a predetermined area containing the reference gate pattern satisfies a constraint condition.

In a layout method and a layout apparatus for a semiconductor integrated circuit according to the present invention, a variation in characteristics of a transistor in a semiconductor integrated circuit, which is caused based on a data density of gates, can be suppressed.

BRIEF DESCRIPTION OF THE DRAWINGS

The above and other objects, advantages and features of the present invention will be more apparent from the following description of certain embodiments taken in conjunction with the accompanying drawings, in which:

FIGS. 8A and 8B are plan views showing the library data and the corrected library data used in the first embodiment of the present invention;

DESCRIPTION OF THE PREFERRED EMBODIMENTS

Hereinafter, an automatic layout apparatus according to the present invention will be described in detail with reference to the attached drawings. In embodiments of the present invention, a semiconductor circuit design supporting apparatus for designing a cell-based semiconductor chip shown in FIG. 5 will be described as an example.

First Embodiment

Figure 1:
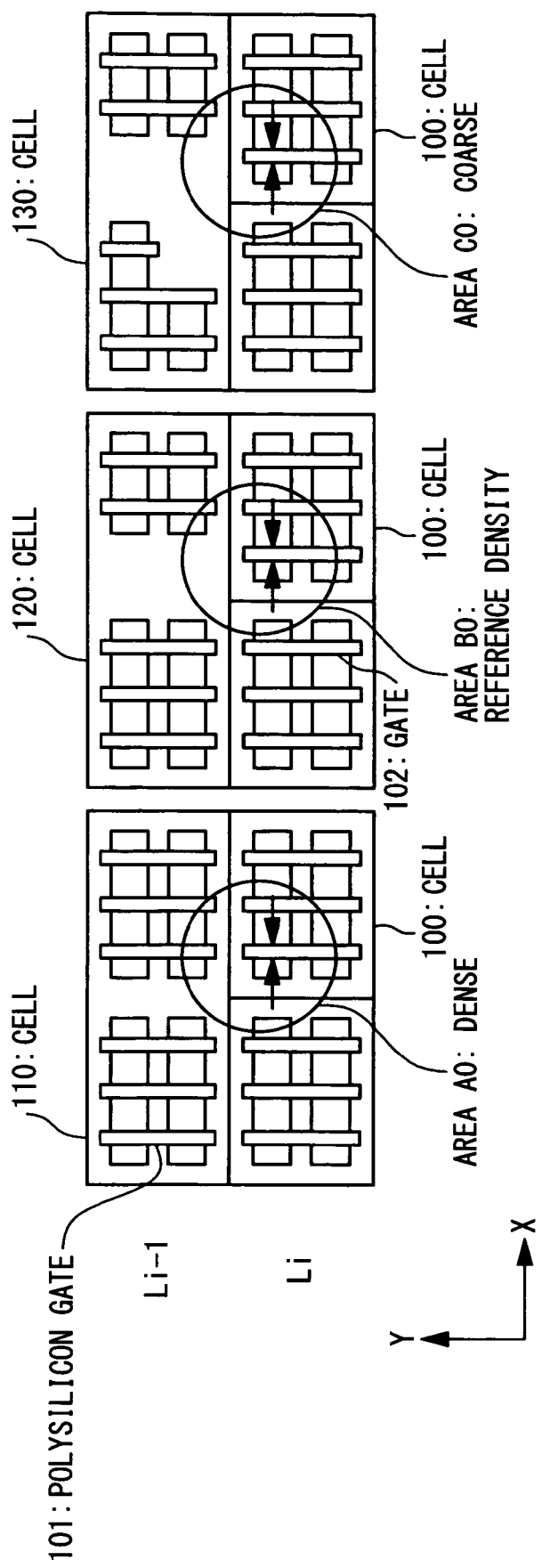
FIG. 1 is a plan view showing arrangements of gate patterns in cell patterns arranged on a semiconductor chip pattern according to a method of a conventional technique.
Figure 2:
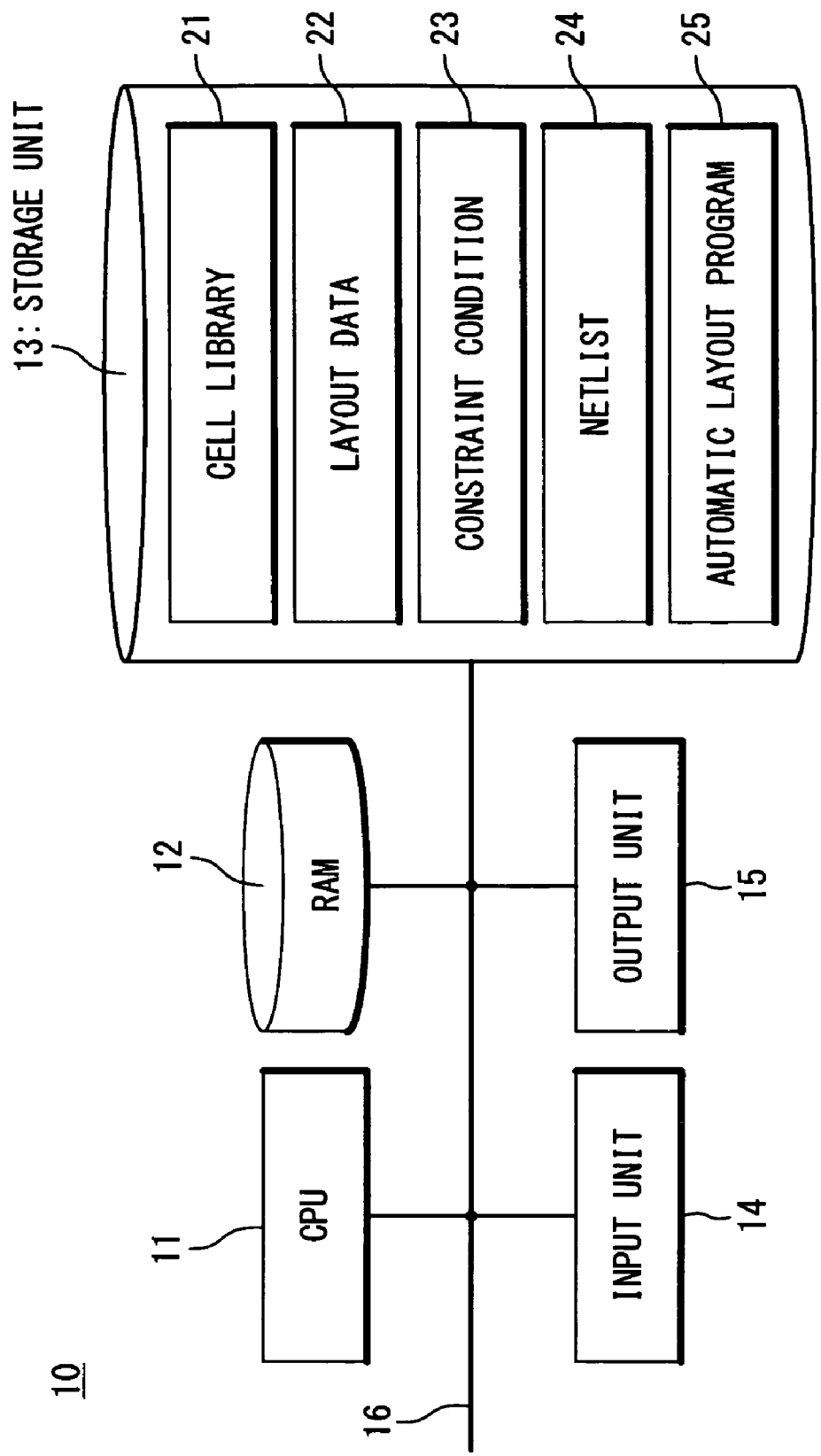
FIG. 2 is a block diagram showing a configuration of an automatic layout apparatus for a semiconductor integrated circuit according to a first embodiment of the present invention.
Figure 3:
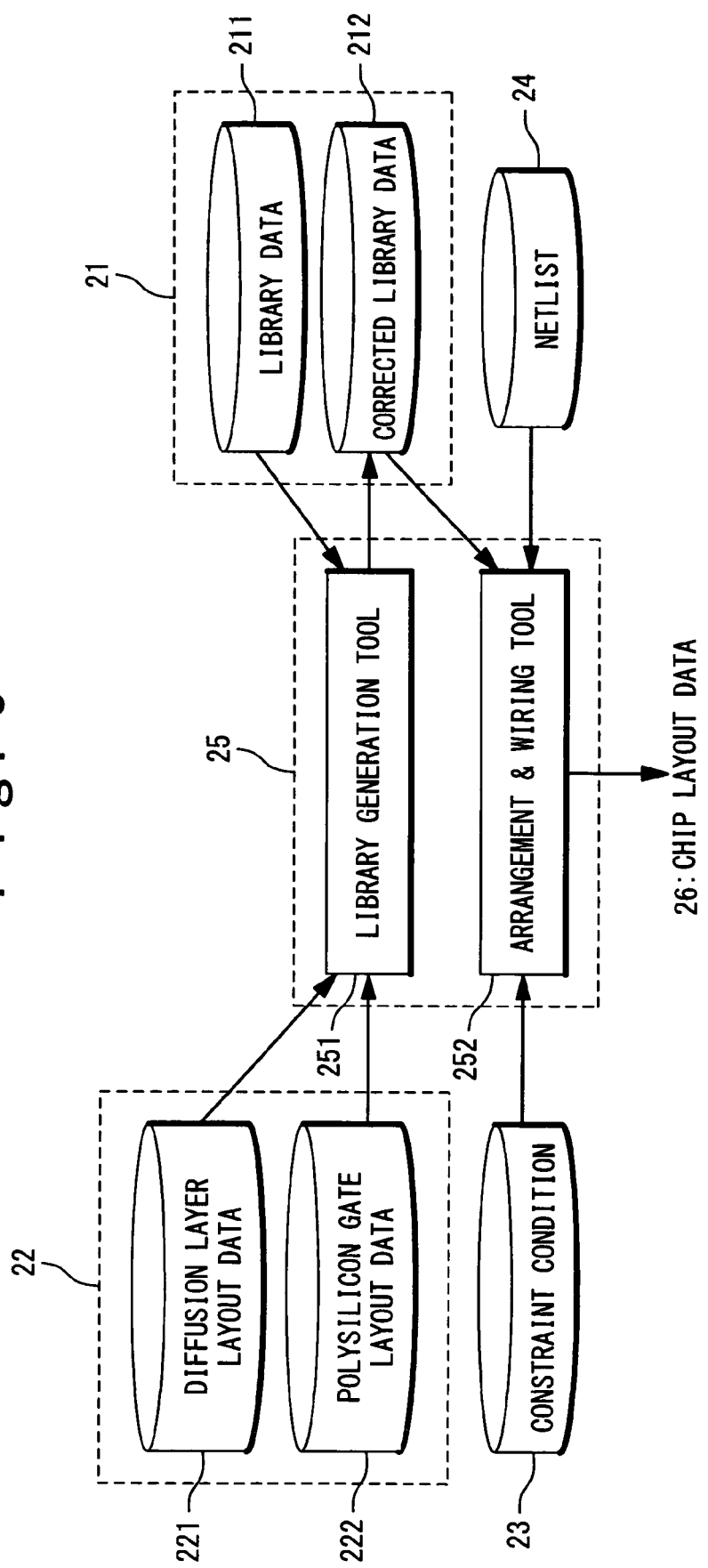
FIG. 3 is a block diagram showing the configuration and operation of the automatic layout apparatus according to the first embodiment of the present invention.

Referring to FIGS. 2 and 3, a configuration of an automatic layout apparatus 10 for a semiconductor integrated circuit according to a first embodiment of the present invention will be described. FIG. 2 is a block diagram showing the configuration of the automatic layout apparatus 10 according to the first embodiment of the present invention. The automatic layout apparatus 10 includes a CPU 11, a RAM 12, a storage unit 13, an input unit 14 and an output unit 15 which are interconnected via a bus 16. The storage unit 13 is an external storage unit such as a hard disc or a memory unit. The input unit 14 is operated by a user by using a keyboard, a mouse or the like to input various data. The output unit 15 is exemplified to a monitor or a printer and visually represents a semiconductor layout outputted from the CPU 11 to the user.

The storage unit 13 stores a cell library 21 for automatic layout, layout data 22, a constraint condition 23, a netlist 24 and an automatic layout program 25. The CPU 11 executes the layout program 25 in the storage unit 13 in response to an instruction from the input unit 14, to perform cell library generation, a conversion process and a cell arrangement & wiring process. At this time, the data and the program in the storage unit 13 are temporarily stored in the RAM 12 and the CPU 11 executes various processes by using the data in the RAM 12.

A set of macro cell patterns is stored in the cell library 21 and each of the macro cell patterns is already designed to lay out elements. Hereinafter, data of the macro cell pattern is referred to as library data. The macro cell patterns include cell patterns for basic circuits such as a NAND circuit and a flip-flop circuit and cell patterns for large-scaled circuits such as a RAM, a ROM and a CPU core. The cell library 21 includes library data 211 having no coordinates of diffusion layer patterns and gate patterns in the cell pattern, and corrected library data 212 in which coordinates of the diffusion layer patterns and the gate patterns in the cell pattern are added to the library data 211. The library data 211 and the corrected library data 212 are an LEF (Library Exchange Format) data which contain data of pin arrangement in the cell pattern and data of a cell frame (cell shape) and are used to arrange and wire the cell patterns on an area corresponding to a semiconductor chip 1 to be described later. Here, the library data 211 includes data of the cell frame, data for designating interconnections and terminals in the cell pattern, locations of external wirings, and data for designating a wiring inhibition area. However, the library data 211 does not include data of cell internal configuration such as layout coordinates of diffusion layer patterns and polysilicon gate patterns which are provided in a lower layer than an interconnection layer. The corrected library data 212 is LEF data obtained by adding the layout data 22 in the cell pattern to the library data 211. The corrected library data 212 includes data of layout of the diffusion layer patterns and the polysilicon gate patterns in the cell pattern in addition to data for designating locations of interconnections and terminals (or node) in the cell pattern.

The layout data 22 is data of a GDS (graphic data system) format and includes data of the size of the cell frame, layout data of interconnections and contacts, layout data 221 of diffusion layer patterns, and layout data 222 of polysilicon gate patterns. The diffusion layer layout data 221 is the layout data including layout coordinates as coordinates of the diffusion layer patterns arranged in the cell pattern. The polysilicon gate layout data 222 is the layout data including layout coordinates as coordinates of the polysilicon gate patterns arranged in the cell pattern. The layout data 22 may include layout coordinates as coordinates of effective gates which are portions functioning as polysilicon gates and provided on the diffusion layer patterns.

The constraint condition 23 is a condition for determining the cell patterns arranged adjacently in the column direction (Y direction) when an arrangement & wiring tool 252 arranges the cell patterns on the semiconductor chip area. Here, referring to FIG. 6, the number of effective gates which can be arranged in a constraint area 600 having a predetermined distance from (a reference point 200 of) a reference gate 111 is set as the constraint condition 23. It is preferred that the constraint condition 23 is set in consideration of size of the constraint area 600 and a width and a length (area) of the effective gate 102.

The netlist 24 is connection data of macro cell patterns.

The layout program 25 is installed from a recording medium to the storage unit 13. The layout program 25 is executed by the CPU 11 to realize functions of a library generation tool 251 and an arrangement & wiring tool 252 in FIG. 3. The library generation tool 251 corrects the library data 211 by using the cell layout data 22 to generate the corrected library data 212. In other words, the library generation tool 251 adds the layout coordinates of the effective gates 102 to the library data 211 to generate the corrected library data 212. For example, the library generation tool 251 calculates the layout coordinates of the effective gates 102 based on the diffusion layer layout data 221 and the polysilicon gate layout data 222 and adds the calculated coordinates to the library data 211. If the layout coordinates of the effective gates 102 are included in the layout data 22, the layout coordinates of the effective gates 102 are extracted from the layout data 22 and added to the library data 211. Furthermore, the library generation tool 251 may add the diffusion layer layout data 221 or the polysilicon gate layout data 222 to generate the corrected library data 212 without adding the layout coordinates of the effective gates to the library data 211.

Figure 4:
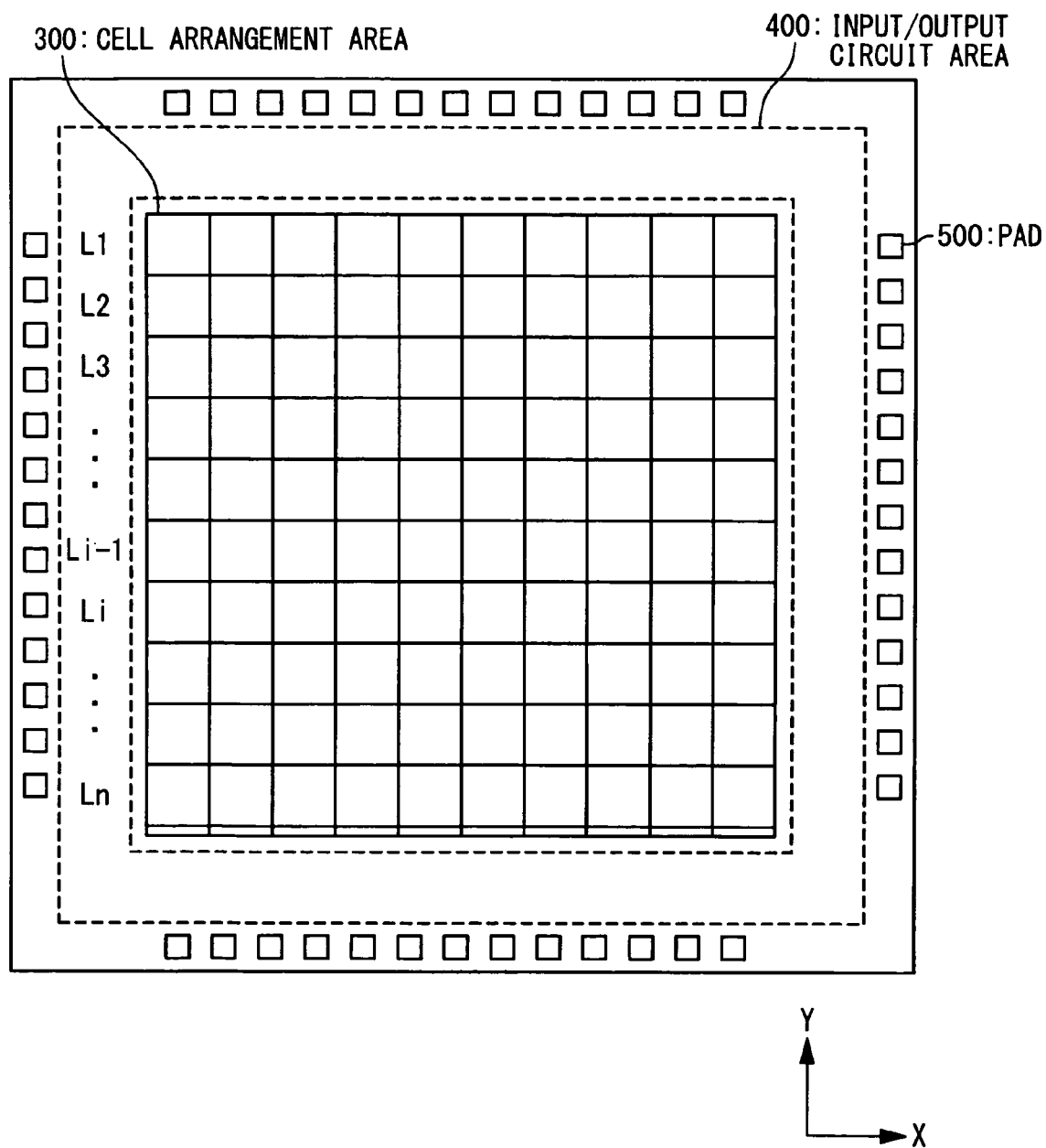
FIG. 4 is a plan view showing a semiconductor chip pattern used in the present invention.

Referring to FIG. 4, the arrangement & wiring tool 252 arranges cell patterns on the semiconductor chip 1 area based on the corrected library data 212. At this time, the arrangement & wiring tool 252 arranges and interconnects the cell patterns based on the pin arrangement and the cell sizes of the macro cell patterns included in the corrected library data 212 in consideration of the netlist 24, design rules on a interconnection width, a distance between cell patterns, and a wiring delay. The arrangement & wiring tool 252 also arranges input/output circuit cells in an input/output circuit area 400 and pads 500 in a peripheral area of the input/output circuit area 400. Thus, the layout of the semiconductor chip 1 is completed. The layout result of the semiconductor chip 1 is stored in the storage unit 13 as chip layout data 26. The chip layout data 26 is also visibly outputted from the output unit 15 and a designer determines whether the layout of the semiconductor chip 1 is valid or invalid based on the visible output. The arrangement & wiring tool 252 in the first embodiment determines the cell patterns to be disposed adjacently in the column direction (Y direction) based on the layouts of the diffusion layer patterns and the polysilicon gate patterns, which are included in the corrected library data 212, and the constraint condition 23.

Figure 5:
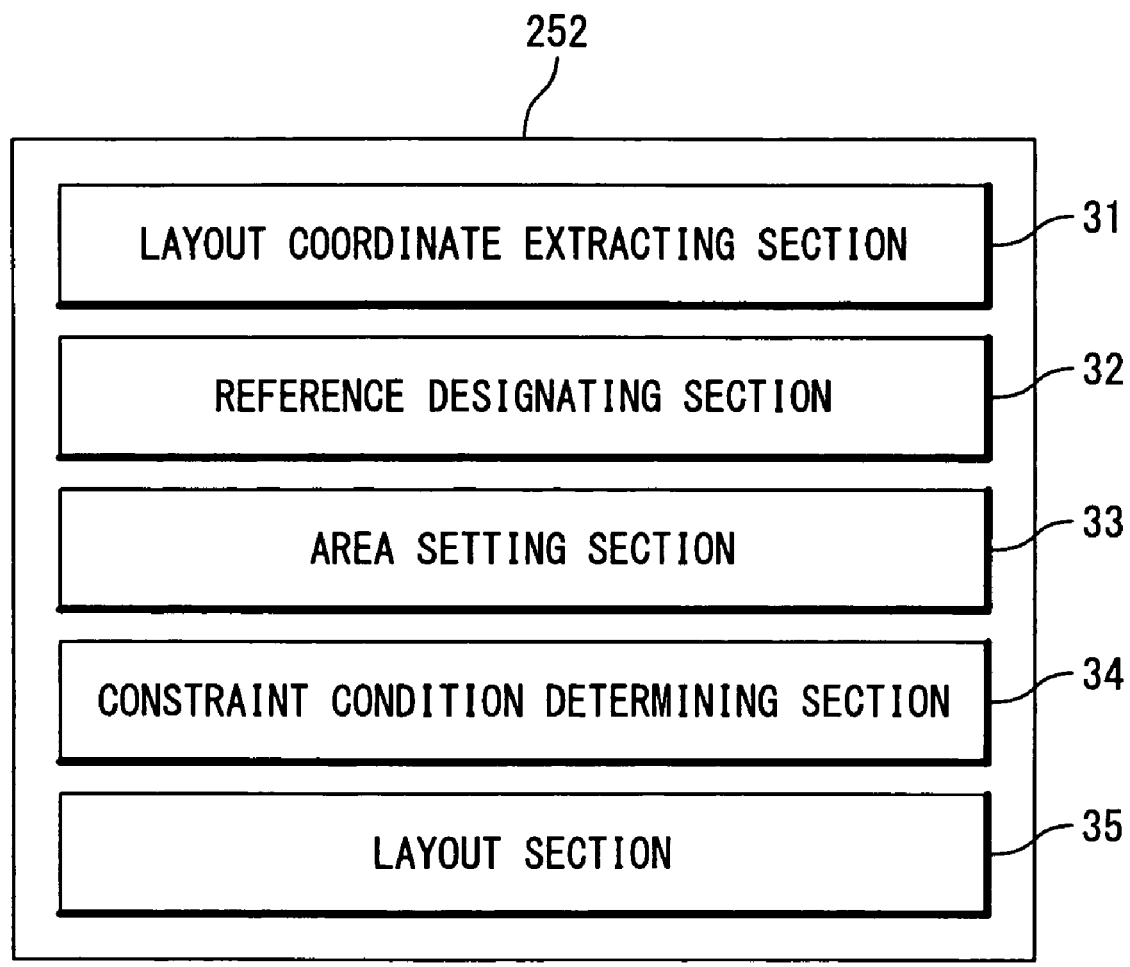
FIG. 5 is a block diagram showing a configuration of an automatic layout program executed in the first embodiment of the present invention.

FIG. 5 is a function block diagram showing the configuration of the arrangement & wiring tool 252. The arrangement & wiring tool 252 has a layout coordinates extracting section 31, a reference gate designating section 32, an area setting section 33, a constraint condition determining section 34 and a layout section 35. Hereinafter, each function of the arrangement & wiring tool 252 will be described in detail.

The layout coordinates extracting section 31 extracts the layout coordinates of the polysilicon gate patterns, the diffusion layer patterns and the effective gate patterns 102, which are arranged in the cell pattern. The layout coordinates extracting section 31 in the first embodiment extracts the layout coordinates of the diffusion layer patterns and layout coordinates of the polysilicon gate patterns from the corrected library data 212 and calculates the layout coordinates of the gate patterns by using both of the layout coordinates. Alternatively, when the layout coordinates of the effective gate patterns 102 are included in the corrected library data 212, the layout coordinates of the effective gate patterns 102 may be extracted.

Figure 6:
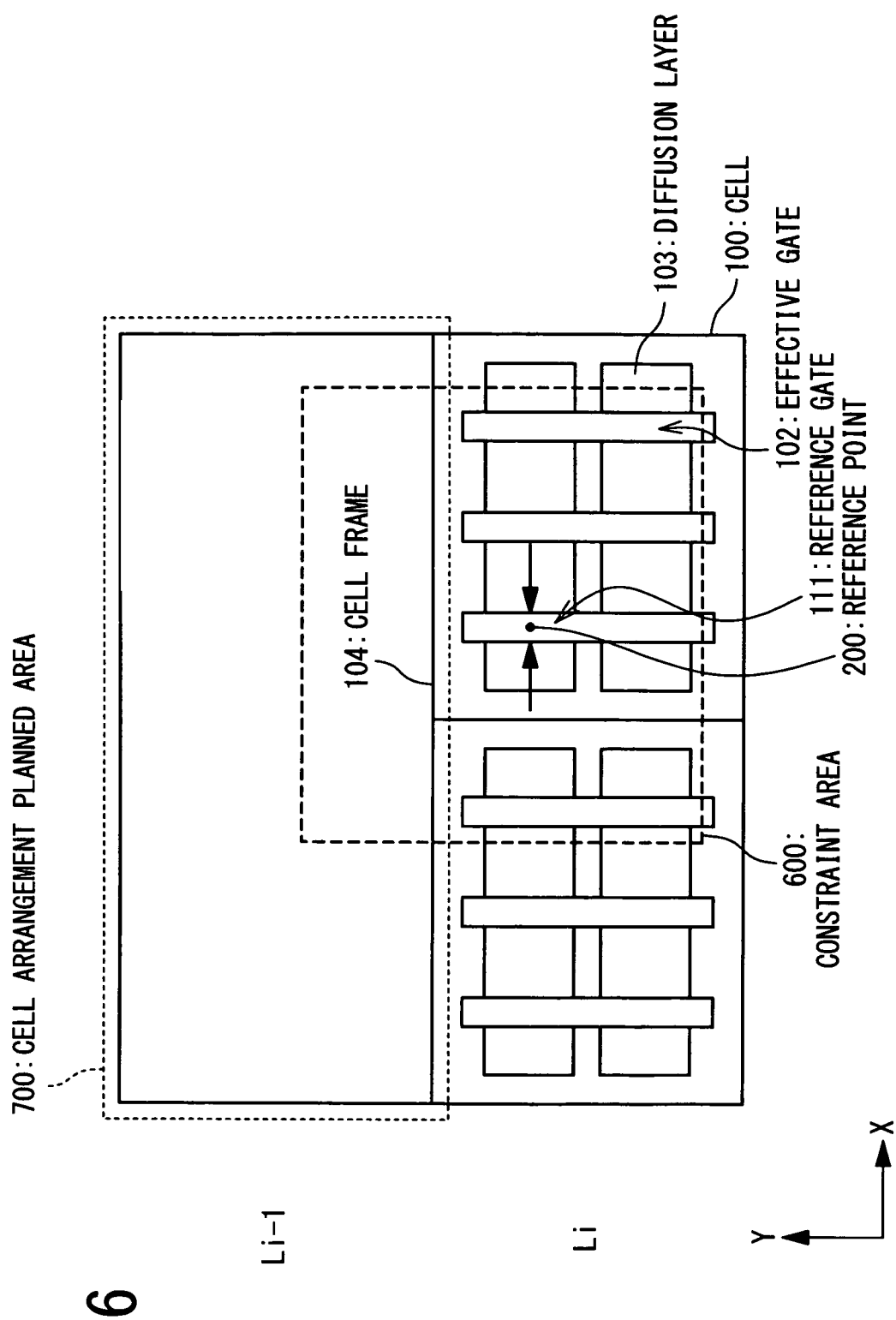
FIG. 6 is a plan view for showing a reference gate pattern, a reference point and a constraint area in the first embodiment.

Referring to FIG. 6, the reference gate designating section 32 sets one gate in which variation caused due to the optical proximity effect is to be suppressed, as a reference gate pattern. In detail, the reference gate designating section 32 designates the reference gate 111 by referring to layout coordinates of the gates extracted by the layout coordinates extracting section 31 numerically or visually. It is preferred that the reference gate designating section 32 sets the reference point 200 on the designated reference gate pattern 111. It is also preferred that the gate pattern set as the reference gate pattern 111 is arranged in the vicinity of or adjacently to the cell frame 104 adjacent to the cell pattern in another row (a boundary with the cell pattern in the other row). It is especially preferred that the gate pattern arranged in the area at the corner of the cell pattern is set as the reference gate pattern 111.

The area setting section 33 sets the constraint area 600 on the basis of the set reference point 200. Preferably, the constraint area 600 is set to cover an area within a predetermined distance from the reference point. For example, the constraint area 600 may be a rectangle in which a distance between the reference point 200 and each side is set to be within a predetermined value, or may be a circle having the reference point 200 as a center. The distance between the reference point 200 and an outer edge of the constraint area 600 may be either uniform or ununiform. It is preferred that the dimension of the constraint area 600 (a distance from the reference point 200) is set based on the extent of the effect of the optical proximity effect, which is considered in OPC and Litho Simulation. Thus, it is preferred that the constraint area 600 is set depending on the wiring width and a data density of the gate patterns.

The constraint condition determining section 34 determines whether or not the number of effective gate patterns 102 in the set constraint area 600 satisfies the constraint condition 23. Referring to FIG. 6, the area adjacent in the Y direction (for example, area in the row Li−1) to a group of cell patterns arranged in the X direction (row Li) is set as a cell arrangement planned area 700. When the cell patterns are arranged in the arrangement planned area 700, the constraint condition determining section 34 calculates the number of effective gate patterns arranged in the constraint area 600 and determines whether or not the number satisfies the constraint condition 23. For example, if the constraint condition 23 is set to 9 or more and 10 or less, the constraint condition determining section 34 determines that the cell patterns are accepted when the number of effective gate patterns existing in the constraint area 600 is 9 or 10 and that the cell patterns are rejected when the number is any number other than 9 and 10.

Referring to the cell library-data 211, the corrected library data 212 and the netlist 24, the layout section 35 arranges cell patterns on the area for the semiconductor chip 1 and interconnects between the cell patterns. The layout section 35 according to the present invention arranges the cell pattern determined to be accepted by the constraint condition determining section 34 in the cell arrangement planned area 700.

Referring to FIGS. 2 to 13, a cell automatic layout process executed by the layout apparatus 10 according to the present invention will be described in detail. The layout apparatus 10 according to the present invention performs the layout of cell patterns on the semiconductor chip 1 area through two phases of a generation process of the corrected library data 212 and a cell arrangement & wiring process.

(Corrected Library Generation Phase)

First, a generation phase of the corrected library data 212 will be described. The library generation tool 251 adds the layout data 22 of the cell patterns corresponding to the library data 211 to the library data 211 to generate the corrected library data 212. Here, the diffusion layer layout data 221, the polysilicon gate layout data 222 and layout coordinates of the effective gate patterns 102 are added to the library data 211. The corrected library data 212 may be generated for only cell patterns mounted on the product or generated for all of previously prepared cell patterns.

Referring to FIGS. 7A and 7B and FIGS. 8A and 8B, a generating method of the corrected library data 212 for the cell patterns will be described below.

Figure 7A:
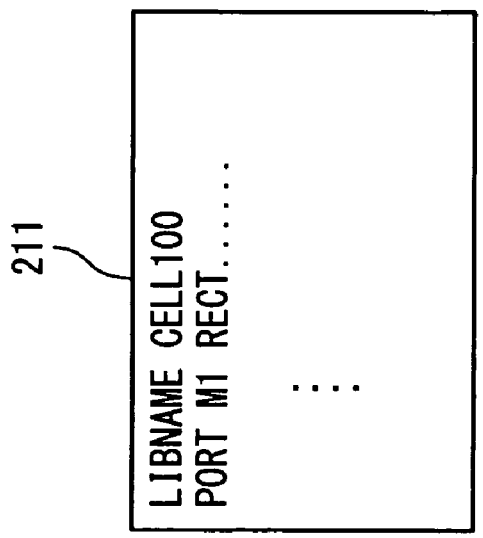
FIGS. 7A and 7B are diagrams showing library data and corrected library data used in the first embodiment of the present invention.

Referring to FIGS. 7A and 7B and FIGS. 8A and 8B, FIG. 7A shows the library data 211, and FIG. 8A shows an interconnection layout corresponding to a pin layout included in the library data 211. As shown in FIGS. 7A and 8A, the library data 211 includes data of interconnection 115 and terminals 116 (i.e., PORT data) and does not include the layout data of the diffusion layer patterns and gate patterns which have no effect on the interconnections.

FIG. 8B is a plan view showing the layout coordinates of the polysilicon gate pattern 101 and the diffusion layer pattern 103 which are laid out below the wiring layer in Z direction. In an example shown in FIG. 8B, a MOS transistor is formed from the polysilicon gate pattern 101 and the diffusion layer pattern 103, which are rectangular. In this case, the polysilicon gate pattern 101 is formed on the diffusion layer pattern 103 and functions as a gate pattern 102 (a gate pattern length L, a gate pattern width W). Here, it is assumed that layout coordinates A(X1, Y1) and B(X2, Y2) are stored as the polysilicon gate layout data 222 and the layout coordinates C(X3, Y3) and D(X4, Y4) are stored as the diffusion layer layout data 221.

Figure 7B:
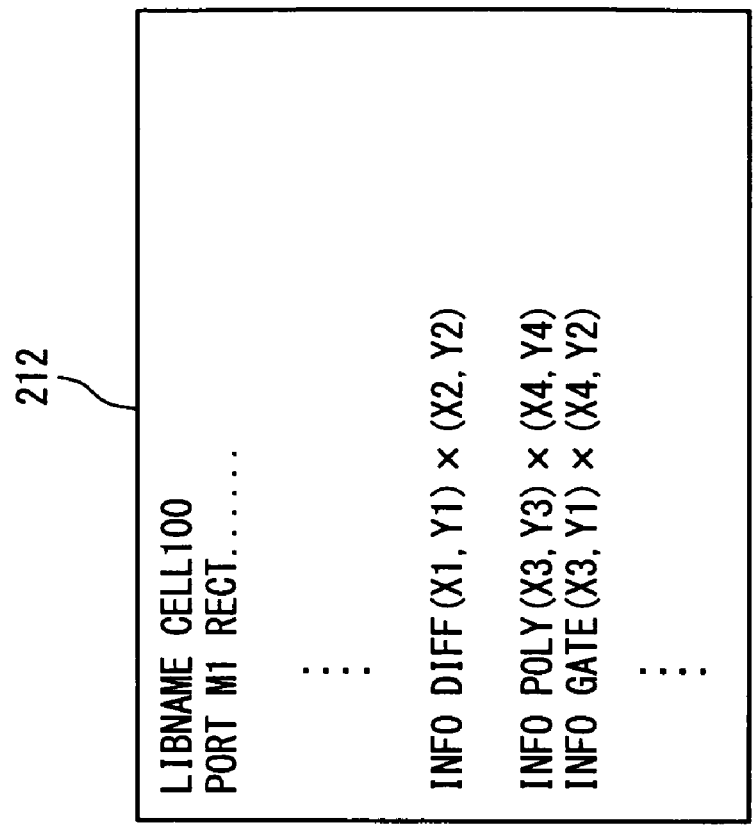

The library generation tool 251 extracts the polysilicon gate layout data 222 and the diffusion layer layout data 221 corresponding to the polysilicon gate pattern 101 and the diffusion layer pattern 103 in the cell pattern, and adds the extracted data to the library data 211 to generate the corrected library data 212. Here, the layout coordinates A(X1, Y1) and B(X2, Y2) of the polysilicon gate pattern 101 and the layout coordinates C(X3, Y3) and D(X4, Y4) of the diffusion layer pattern 103 are added to the library data 211. Thus, the corrected library data 212 is generated as shown in FIG. 7B. At this time, by using the layout coordinates A(X1, Y1) and B(X2, Y2) of the polysilicon gate pattern and the layout coordinates C(X3, Y3) and D(X4, Y4) of the diffusion layer pattern 103, the library generation tool 251 may calculate the layout coordinates E(X3, Y1) and F(X4, Y2) of the effective gate pattern 102 and add the calculated coordinates to the corrected library data 212. However, the corrected library data 212 does not need to include layout coordinates of the effective gate pattern 102. In this case, amount of data in the corrected library data 212 can be made smaller.

In this example, since the shapes of the diffusion layer pattern 103 and the polysilicon gate pattern 102 are rectangular, only coordinates of the corners are added to generate the corrected library data 212. However, the present invention is not limited to this, and preferably, such layout coordinates used to calculate the shapes and areas of the diffusion layer and the polysilicon gate pattern and positions of them in the cell pattern (relative positions from the cell frame) are added to generate the corrected library data 212.

As described above, the layout apparatus 10 according to the present invention adds the layout data of diffusion layer patterns and gate patterns which are formed below the wiring layer to the cell library 21 as an input to the arrangement & wiring tool 252 to generate the corrected library data 212.

(Cell Layout Phase)

Next, referring to FIGS. 9 to 13, a cell layout process by the arrangement & wiring tool 252 will be described. Here, the constraint condition 23 (the number of effective gate patterns 102 which can exist in the constraint area 600) is set to "10 or more and 11 or less".

First, the layout section 35 arranges a cell pattern group including the cell pattern 100 in the row Li direction on the area for the semiconductor chip 1 shown in FIG. 4. Subsequently, the reference gate designating section 32 specifies the reference gate pattern 111 and sets a predetermined position on the reference gate pattern 111 as the reference point 200. Referring to coordinates of the effective gate patterns 102 extracted by the layout coordinates extracting section 31, the reference gate designating section 32 knows positions of the effective gate patterns 102 in the cell pattern 100 and sets the reference gate pattern 111 and the reference point 200. Here, one of the effective gate patterns 102 adjacent to a boundary with a cell pattern group in the row Li−1 direction as a cell arrangement planned area 700 (cell frame 104) and a boundary with another cell pattern adjacent in the X direction is selected as the reference gate pattern 111.

The reference gate pattern 111 and the reference point 200 are set in a cell pattern having a same layout as the cell pattern 100 and located on a different position in the cell pattern group arranged in the row Li direction in a similar manner. In this case, it is preferred that the set reference gate pattern 111 and reference point 200 have same position coordinates in the X direction in the cell pattern.

When the reference point 200 is set, the area setting section 33 sets an area within a predetermined distance from the reference point 200 as the constraint area 600. Here, a rectangular constraint area 600 is set.

Figure 9:
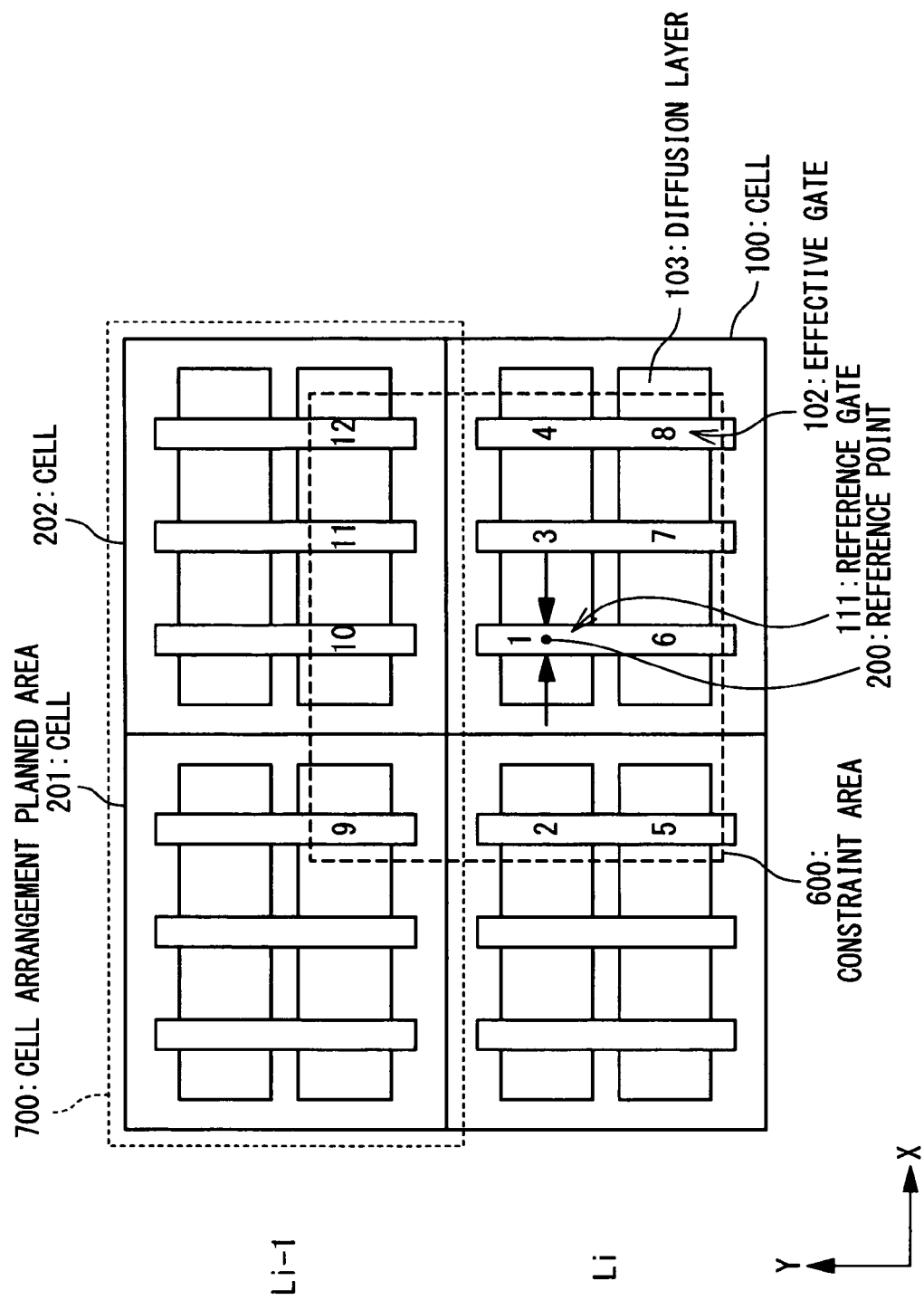
FIG. 9 is a plan view showing an example of a layout pattern when the number of gate patterns existing in the constraint area exceeds a constraint condition.

Next, the constraint condition determining section 34 determines an area adjacent in the Y direction to the cell pattern group arranged in the row Li as the cell arrangement planned area 700 and calculates the number of effective gate patterns 102 in the constraint area when the cell patterns are arranged in the area 700. Here, the cell pattern group is arranged in the area 700 of the row Li−1 and the number of effective gate patterns 102 existing in the constraint area 600 at this time is calculated. Then, it is determined whether or not the number satisfies the constraint condition 23, that is, "10 or more and 11 or less". For example, as shown in FIG. 9, the constraint condition determining section 34 simulates a case where the cell pattern group including a cell pattern 201 and a cell pattern 202 which are adjacent to each other in the X direction is arranged in the arrangement planned area 700 (row Li−1). However, the cell pattern 202 is arranged in adjacent to the cell pattern 100 in the Y direction. Referring to coordinates of the effective gate patterns 102 which are extracted in each cell pattern by the layout coordinates extracting section 31, the constraint condition determining section 34 calculates the number of effective gate patterns 102 existing in the constraint area 600. Here, the number of effective gate patterns existing in the constraint area 600 is calculated as "12". In this case, since the number of effective gate patterns 102, "12" is outside of the constraint condition 23, the cell pattern is determined to be rejected.

Figure 10:
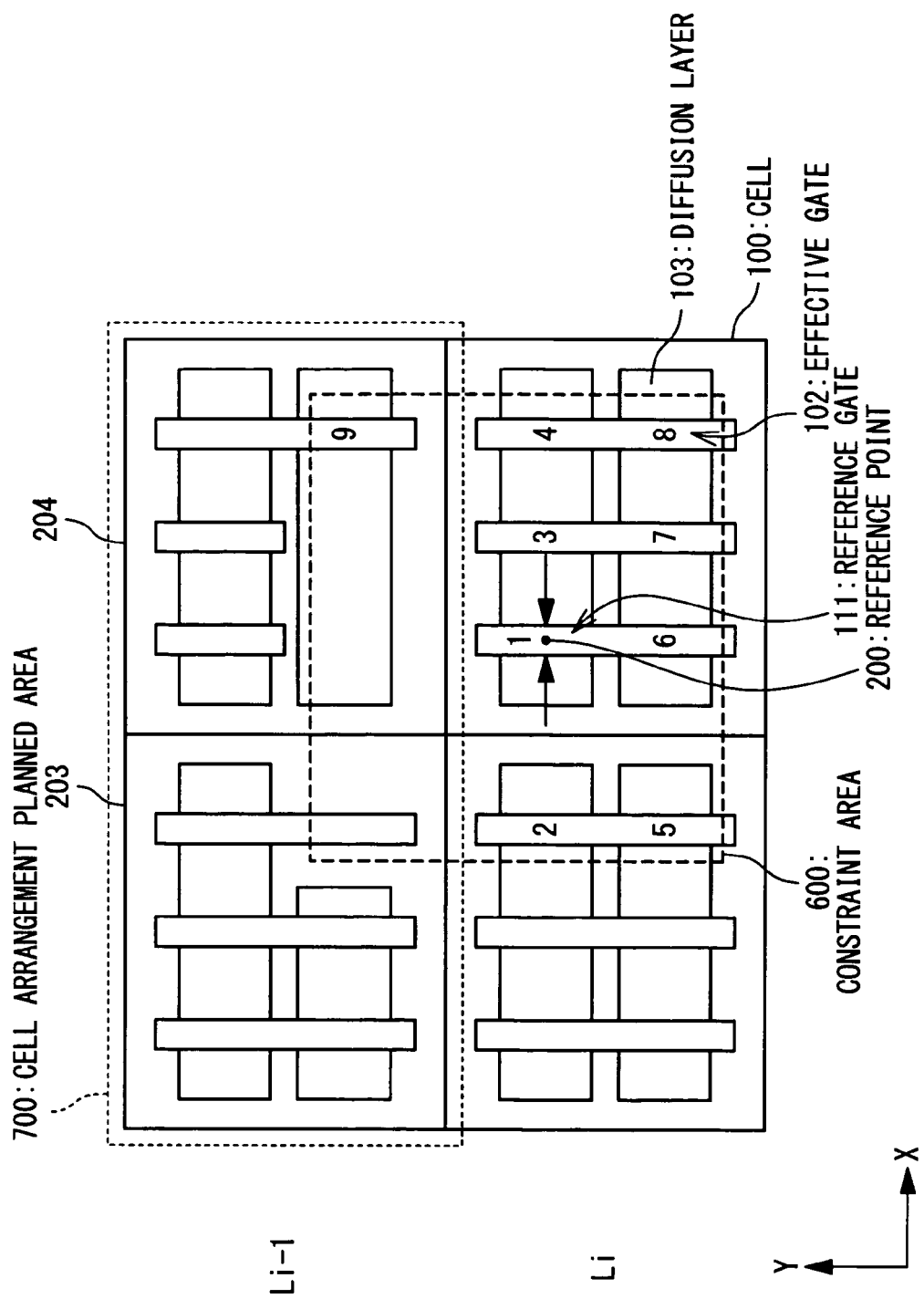
FIG. 10 is a plan view showing an example of a layout pattern when the number of gate patterns existing in the constraint area is smaller than the constraint condition.

Referring to FIG. 10, when a cell pattern group including a cell pattern 203 and a cell pattern 204 which are adjacent to each other in the X direction is arranged in the arrangement planned area 700 (row Li−1), the cell pattern is determined to be rejected since the number of effective gate patterns 102 existing in the constraint area 600 is "9". Here, the cell pattern 204 is arranged adjacent to the cell pattern 100 in the Y direction.

Figure 11:
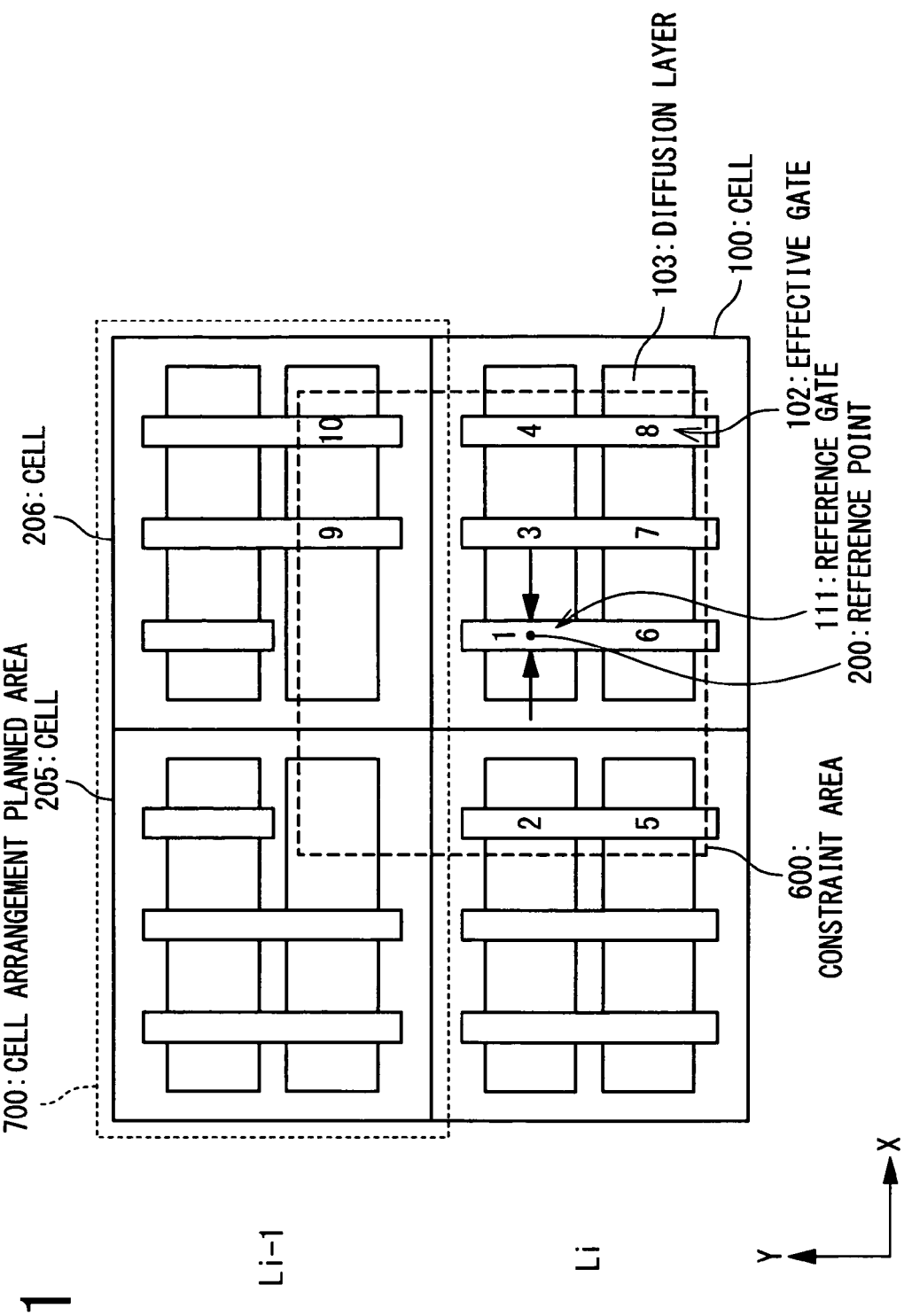
FIG. 11 is a plan view showing an example of a layout pattern when the number of gate patterns existing the constraint area satisfies the constraint condition.

On the other hand, as shown in FIG. 11, when a cell pattern group including a cell pattern 205 and a cell pattern 206 which are adjacent to each other in the X direction is arranged in the arrangement planned area 700 (row Li−1), the cell pattern satisfies the constraint condition 23 since the number of effective gate patterns 102 existing in the constraint area 600 is "10". Here, the cell pattern 206 is arranged adjacent to the cell pattern 100 in the Y direction.

When the number of effective gate patterns 102 existing in the constraint area 600 complies with the constraint condition 23, the layout section 35 arranges the cell pattern satisfies the constraint condition 23 in the cell arrangement planned area 700. In an example shown in FIG. 11, the cell pattern 205 and the cell pattern 206 are arranged in the cell arrangement planned area 700.

Figure 12:
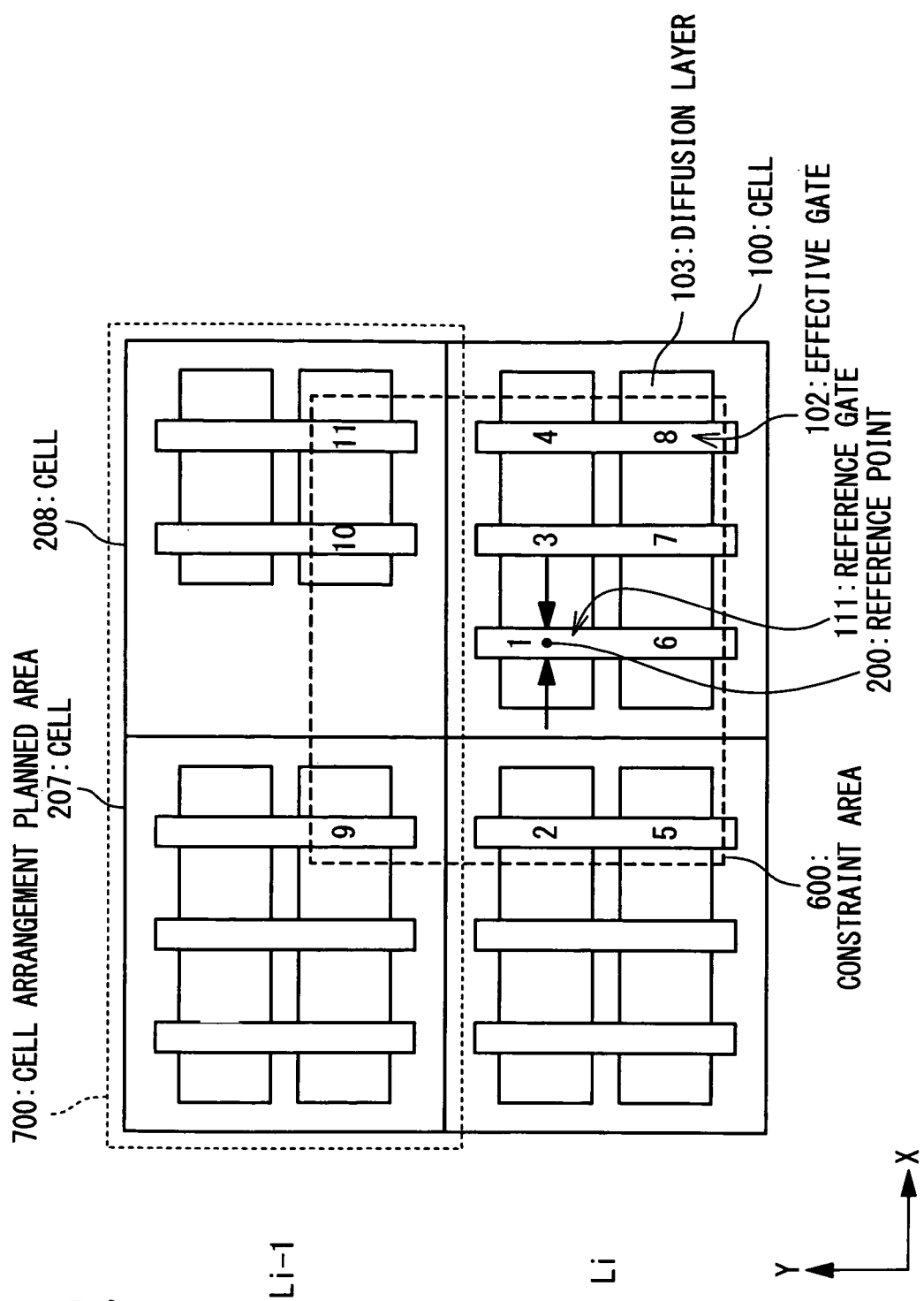
FIG. 12 is a plan view showing an example of layout configuration when the number of gate patterns existing in the constraint area satisfies the constraint condition.

As described above, the cell arranging process and the determining process using the constraint condition 23 are executed for other reference gate patterns 111 (reference points 200) in the row Li in a similar manner. At this time, cell patterns arranged in adjacent to the cell pattern 100 in the same row (for example, row Li−1) are not necessarily the cell patterns having the same pattern. In this example, as long as the cell pattern satisfies the constraint condition 23, any cell pattern other than the cell pattern 205 and the cell pattern 206 in FIG. 11 may be selected. For example, as shown in FIG. 12, since the number of effective gate patterns 102 existing in the constraint area 600 is "10", a cell pattern 207 and a cell pattern 208 satisfies the constraint condition 23, and thus can be arranged in the cell arrangement planned area 700 adjacent to the cell pattern 100.

Figure 13:
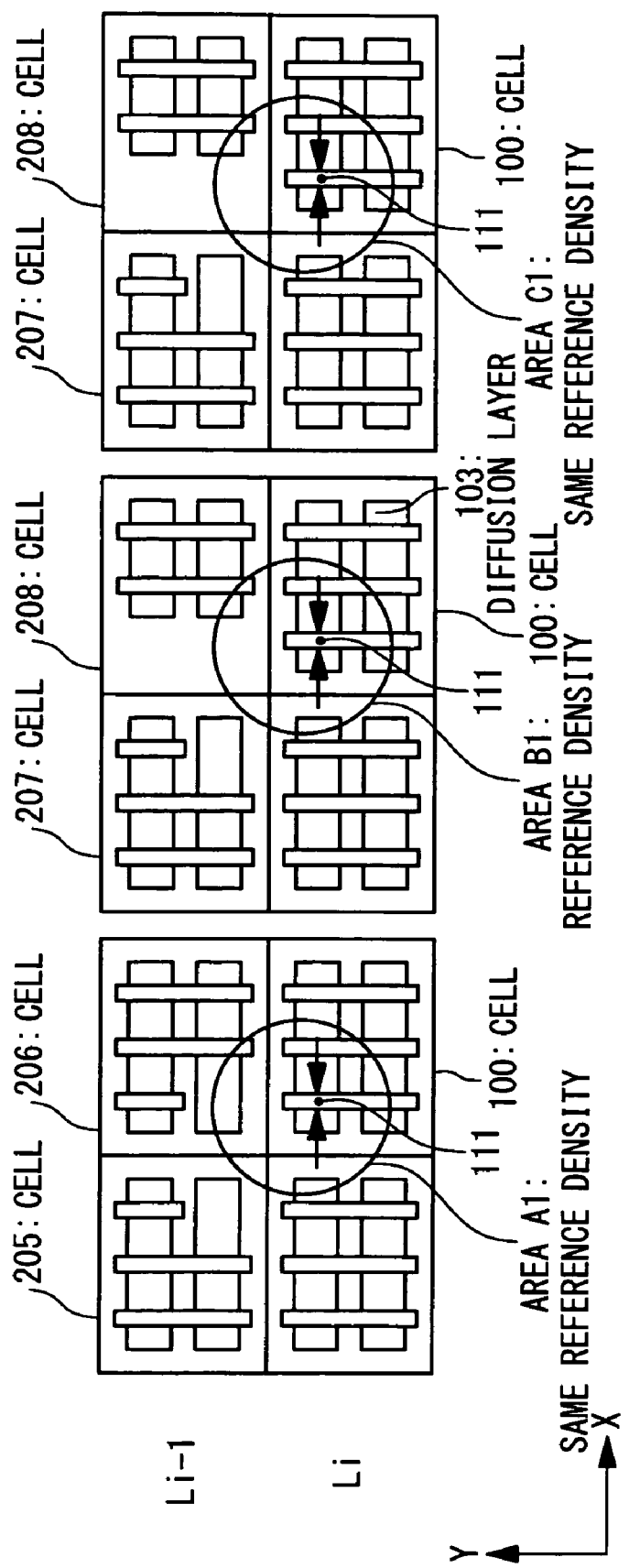
FIG. 13 is a plan view showing an arrangement of gate patterns in cell patterns arranged on the semiconductor chip pattern in the automatic layout method according to the present invention.

As described above, the cell pattern group i's arranged in the row Li−1 adjacent in the Y direction to the row Li. FIG. 13 is a plan view showing an example in which cell patterns are arranged by the layout apparatus 10. According to the present invention, the number of effective gate patterns 102 in the areas A1, B1, C1 in the peripheries of the respective reference gate patterns (reference point 200) of the cell patterns 100 arranged in the row Li falls within the range defined by the constraint condition 23. For this reason, data densities of the gate patterns in the areas A1, B1, C1 become uniform and variation in patterns caused due to the optical proximity effect and variation in gate pattern size (gate pattern shape) after etching can be reduced.

Second Embodiment

Figure 14:
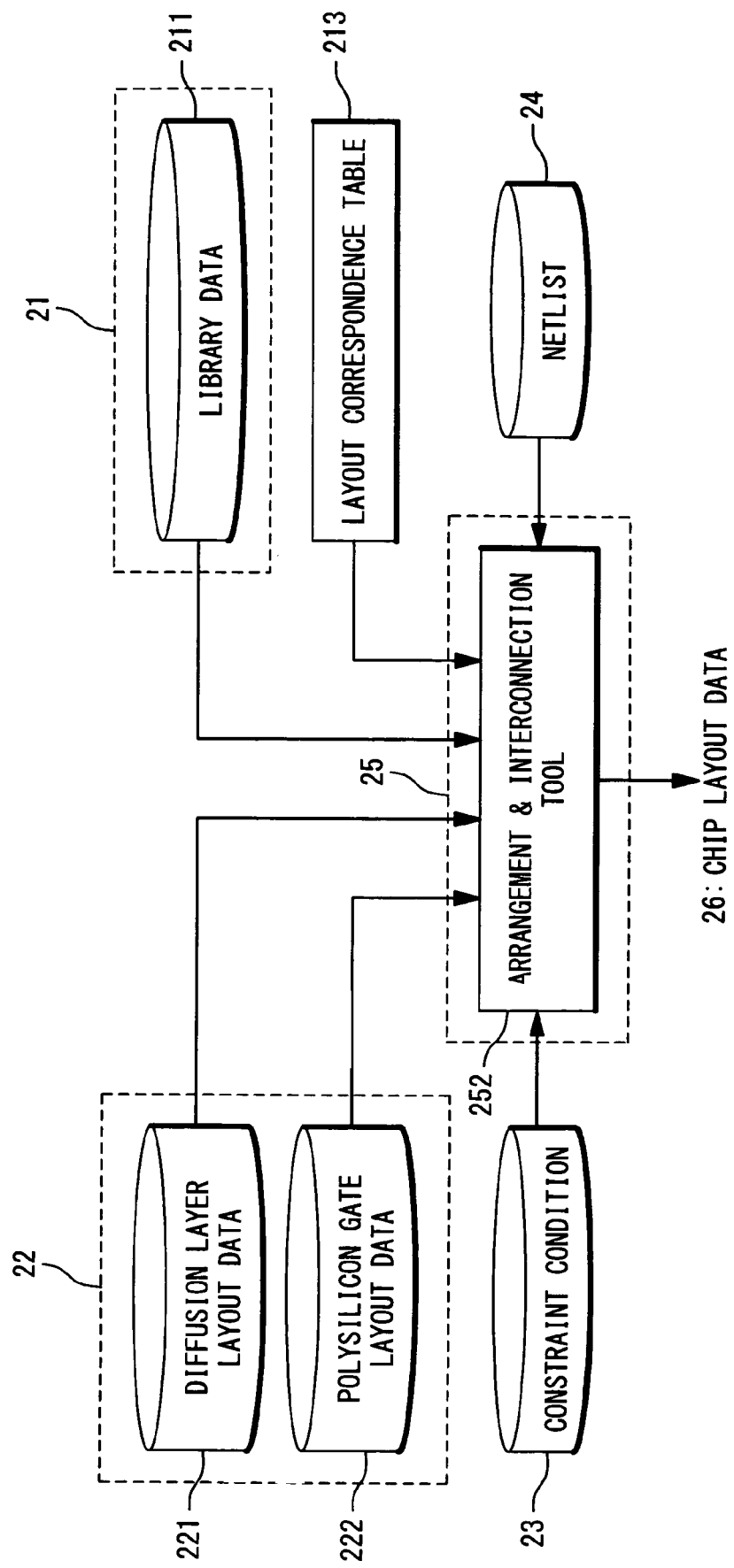
FIG. 14 is a block diagram showing the configuration and operation of the automatic layout apparatus for a semiconductor integrated circuit according to a second embodiment of the present invention.

Referring to FIG. 14, a configuration and an operation of a layout apparatus 10 according to a second embodiment of the present invention will be described. The layout apparatus 10 in the second embodiment does not extracts the layout coordinates of the effective gate patterns 102 from the corrected library data 212, but extracts the layout coordinates of the effective gate patterns 102 by referring to the layout data 22, unlike the layout apparatus 10 in the first embodiment.

Hereinafter, the same reference numerals are assigned to same components as those in the first embodiment. Description of the similar configuration and operations to those in the first embodiment is omitted and only differences will be described.

FIG. 14 is a block diagram showing the configuration of the layout apparatus 10 according to the second embodiment of the present invention. The storage unit 13 in the second embodiment stores the library data 211 as the cell library 21. The storage unit 13 stores a layout correspondence table 213. The automatic layout program 25 does not include the library generation tool 251. Other configuration in the second embodiment is the same as that in the first embodiment.

A layout correspondence table 213 is a table in which the library data 211 and the layout data 22 for a same cell pattern are associated with each other and recorded.

The layout coordinates extracting section 31 of the arrangement & wiring tool 252 in the second embodiment acquires the library data 211 of the cell patterns to be arranged, and refers to the layout correspondence table 213, to extract the diffusion layer layout data 221 and the polysilicon gate layout data 222 which are associated with the library data 211. Then, by using the diffusion layer layout data 221 and the polysilicon gate layout data 222, the layout coordinates extracting section 31 calculates layout coordinates of the effective gate patterns 102.

An operation of the automatic layout apparatus 10 in the second embodiment is the same as that in the first embodiment except for the above-mentioned extracting process of the layout coordinates.

Even if the corrected library data 212 cannot be prepared, the automatic layout apparatus 10 in the second embodiment can arrange the cell patterns so that a data density becomes uniform, by referring to the layout coordinates of gate patterns in the cell pattern.

As described above, according to the present invention, when the cell patterns are arranged adjacent to each other in a gate length direction, cell patterns to be arranged are determined so that the gate pattern arranged in the vicinity of the boundary of cell patterns is defined as the reference gate pattern and the number of gate patterns existing in a predetermined area around the reference gate pattern (gate density) falls within a predetermined scope. Thus, the data density of the gate patterns in the reference gate peripheral area becomes uniform and variation in a gate pattern due to the optical proximity effect and variation in a gate size and gate shape after etching can be reduced. In this manner, according to the present invention, by layout of the cell patterns in consideration of lithography, variation among cell patterns in gate driving characteristics can be suppressed.

Although the embodiments of the present invention have been described in detail, the present invention is not limited to the specific configurations to the above-embodiments and various modifications which are not apart from the scope of the present invention are contained in the present invention. In the present embodiment, the corrected library data 212 including the layout data 22 is prepared for a cell arrangement. However, when library data including coordinates of the diffusion layer patterns and the gate patterns are previously prepared, the process executed by the library generation tool 251 may be omitted and automatic layout may be performed using the prepared library data.

Automatic layout according to the present invention can be applied to the whole of circuits on one semiconductor chip. Alternatively, a conventional method may be applied to circuits not requiring precise timings on one semiconductor chip, and automatic layout according to the present invention is applied to circuits requiring precise timings. Thus, variation can be suppressed in characteristics.

What is claimed is:

1. A layout method for a semiconductor integrated circuit by using cell library data, said method comprising:
    arranging a plurality of cell patterns in a first direction, as executed by a computer;
    specifying one of gate patterns in one of said plurality of cell patterns as a reference gate pattern; and
    arranging an additional cell pattern in a second direction orthogonal to the first direction such that a number of gate patterns within a predetermined area comprising the reference gate pattern satisfies a constraint condition.

2. The layout method according to claim 1, further comprising:
    acquiring layout coordinates of gate patterns in each of said plurality of cell patterns,
    wherein said arranging an additional cell pattern in a second direction comprises:
        determining the predetermined area based on the acquired layout coordinates; and
        determining the additional cell pattern to be arranged in the second direction such that the number of gate patterns within the predetermined area satisfies the constraint condition.

3. The layout method according to claim 2, wherein said cell library data comprises layout coordinates of said gate patterns, and
    wherein said acquiring comprises:
        extracting the layout coordinates of said gate patterns from said cell library data.

4. The layout method according to claim 2, wherein said acquiring further comprises:
    using layout coordinates of diffusion layer patterns and layout coordinates of polysilicon gate patterns to calculate the layout coordinates of said gate patterns.

5. The layout method according to claim 4, wherein said cell library data comprises the layout coordinates of the diffusion layer patterns and the layout coordinates of polysilicon gate patterns, and
    wherein said acquiring comprises:
        extracting the layout coordinates of the diffusion layer patterns and the layout coordinates of polysilicon gate patterns from said cell library data.

6. The layout method according to claim 1, wherein said specifying comprises:
    selecting the specified gate pattern arranged to be adjacent to a cell frame of the cell pattern, as the reference gate pattern.

7. The layout method according to claim 6, wherein said specifying comprises:
    selecting the specified gate pattern arranged at a corner in the cell pattern, as the reference gate pattern.

8. A layout apparatus, comprising:
    a storage unit configured to store cell library data; and
    an arrangement and wiring tool configured to arrange a plurality of cell patterns in a first direction, by using the cell library data,
    wherein said arrangement & wiring tool comprises:
        a reference gate specifying section configured to specify one of gate patterns in one of the plurality of cell patterns as a reference gate pattern; and
        a layout section configured to arrange an additional cell pattern in a second direction orthogonal to the first direction such that a number of gate patterns in a predetermined area comprising the reference gate pattern satisfies a constraint condition.

9. The layout apparatus according to claim 8, wherein said arrangement and wiring tool further comprises a layout coordinates extracting section configured to acquire layout coordinates of the gate patterns in each of the plurality of cell patterns, and
    said layout section determines the predetermined area based on the layout coordinates of the gate patterns, and arranges the additional cell pattern to be adjacent to the cell pattern in the second direction such that the number of gate patterns within the predetermined area satisfies the constraint condition.

10. The layout apparatus according to claim 9, wherein said cell library data comprises layout coordinates of the gate patterns, and
    wherein said layout coordinate extracting section extracts the layout coordinates of the gate patterns from said cell library data.

11. The layout apparatus according to claim 9, wherein said layout coordinates extracting section calculates the layout coordinates of the gate patterns by using layout coordinates of diffusion layer patterns and layout coordinates of polysilicon gate patterns.

12. The layout apparatus according to claim 11, wherein said cell library data comprises the layout coordinates of the diffusion layer patterns and the layout coordinates of the polysilicon gate patterns, and wherein said layout coordinate extracting section extracts the layout coordinates of the diffusion layer patterns and the layout coordinates of the polysilicon gate patterns from said cell library data.

13. The layout apparatus according to claim 8, wherein said reference gate specifying section selects the gate pattern arranged to be adjacent to a cell frame of the cell pattern, as the reference cell pattern.

14. The layout apparatus according to claim 13, wherein said reference gate specifying section selects the gate pattern arranged at a corner in the cell pattern as the reference gate pattern.

15. A non-transitory computer-readable medium which stores instructions which when executed by a computer, cause the computer to realize a layout method for a semiconductor integrated circuit by using cell library data, said layout method comprising:

arranging a plurality of cell patterns in a first direction;
specifying one of gate patterns in one of said plurality of cell patterns as a reference gate pattern; and
arranging an additional cell pattern in a second direction orthogonal to the first direction such that a number of gate patterns within a predetermined area comprising the reference gate pattern satisfies a constraint condition.

16. The non-transitory computer-readable medium according to claim 15, wherein the layout method further comprises:

acquiring layout coordinates of gate patterns in each of the plurality of cell patterns, wherein said arranging an additional cell pattern in a second direction comprises:
determining the predetermined area based on the acquired layout coordinates; and
determining the additional cell pattern to be arranged in the second direction such that the number of gate patterns within the predetermined area satisfies the constraint condition.

17. The non-transitory computer-readable medium according to claim 16, wherein said cell library data comprises layout coordinates of said gate patterns, and wherein said acquiring comprises:
extracting the layout coordinates of said gate patterns from said cell library data.

18. The non-transitory computer-readable medium according to claim 16, wherein said acquiring further comprises:

using layout coordinates of diffusion layer patterns and layout coordinates of polysilicon gate patterns to calculate the layout coordinates of said gate patterns.

19. The non-transitory computer-readable medium according to claim 18, wherein said cell library data comprises the layout coordinates of diffusion layer patterns and the layout coordinates of polysilicon gate patterns, and wherein said acquiring comprises:
extracting the layout coordinates of diffusion layer patterns and the layout coordinates of polysilicon gate patterns from said cell library data.

* * * * *